(12) United States Patent
Esteve et al.

(10) Patent No.: US 9,666,696 B2
(45) Date of Patent: May 30, 2017

(54) METHOD OF MANUFACTURING A VERTICAL JUNCTION FIELD EFFECT TRANSISTOR

(71) Applicant: Infineon Technologies Austria AG, Villach (AT)

(72) Inventors: Romain Esteve, Treffen am Ossiacher See (AT); Cédric Ouvrard, Villach (AT)

(73) Assignee: Infineon Technologes Austria AG, Villach (AT)

( * ) Notice: Subject to any disclaimer, the term of this patent is extended or adjusted under 35 U.S.C. 154(b) by 48 days.

(21) Appl. No.: 14/935,139

(22) Filed: Nov. 6, 2015

(65) Prior Publication Data
US 2016/0064534 A1     Mar. 3, 2016

Related U.S. Application Data

(62) Division of application No. 13/771,975, filed on Feb. 20, 2013, now Pat. No. 9,209,318.

(51) Int. Cl.
| | |
|---|---|
| *H01L 29/66* | (2006.01) |
| *H01L 29/808* | (2006.01) |
| *H01L 29/417* | (2006.01) |
| *H01L 29/08* | (2006.01) |
| *H01L 29/10* | (2006.01) |
| *H01L 21/02* | (2006.01) |
| *H01L 21/04* | (2006.01) |
| *H01L 29/16* | (2006.01) |
| *H01L 29/20* | (2006.01) |

(52) U.S. Cl.
CPC .. *H01L 29/66909* (2013.01); *H01L 21/02378* (2013.01); *H01L 21/0465* (2013.01); *H01L 29/0843* (2013.01); *H01L 29/1066* (2013.01); *H01L 29/41766* (2013.01); *H01L 29/8083* (2013.01); *H01L 29/1608* (2013.01); *H01L 29/2003* (2013.01)

(58) Field of Classification Search
None
See application file for complete search history.

(56) References Cited

U.S. PATENT DOCUMENTS

| | | | |
|---|---|---|---|
| 5,702,987 A | * | 12/1997 | Chen ............. H01L 29/66909 257/E21.447 |
| 6,767,783 B2 | | 7/2004 | Casady et al. |
| 6,974,720 B2 | | 12/2005 | Sumakeris et al. |
| 7,719,080 B2 | | 5/2010 | Zhang |

(Continued)

FOREIGN PATENT DOCUMENTS

| | | |
|---|---|---|
| EP | 0868750 A1 | 10/1998 |
| WO | 9723911 A1 | 7/1997 |
| WO | 2009009380 A1 | 1/2009 |

*Primary Examiner* — Bilkis Jahan
(74) *Attorney, Agent, or Firm* — Murphy, Bilak & Homiller, PLLC

(57) ABSTRACT

A method of manufacturing a vertical junction field effect transistor (JFET) includes forming a drain in a semiconductor substrate, forming a compound semiconductor epitaxial layer on the semiconductor substrate, and forming a source, a gate, a drift region, and a body diode all in the same compound semiconductor epitaxial layer. The drain is vertically spaced apart from the source and the gate by the drift region. The body diode is connected between the drain and the source.

12 Claims, 14 Drawing Sheets

(56) References Cited

U.S. PATENT DOCUMENTS

| | | |
|---|---|---|
| 7,745,273 B2 | 6/2010 | Treu et al. |
| 2005/0067630 A1* | 3/2005 | Zhao ................... H01L 29/8083 257/134 |
| 2005/0082542 A1 | 4/2005 | Sumakeris et al. |
| 2006/0214200 A1* | 9/2006 | Nonaka ............... H01L 29/7722 257/292 |
| 2008/0308838 A1* | 12/2008 | McNutt ............... H01L 21/8232 257/133 |
| 2010/0163935 A1* | 7/2010 | Shimizu ............ H01L 29/42316 257/263 |
| 2011/0121387 A1* | 5/2011 | Hebert ............. H01L 29/66727 257/334 |

* cited by examiner

METHOD OF MANUFACTURING A VERTICAL JUNCTION FIELD EFFECT TRANSISTOR

TECHNICAL FIELD

The instant application relates to junction field effect transistors (JFETs), more particularly, to vertical JFETs with integrated body diodes.

BACKGROUND

Some conventional SiC JFETs are constructed from two different epitaxial layers grown on a semiconductor substrate in order to adequately form all implanted regions of the device, i.e. the drain, source, gate, and an integrated body diode. For example, the drain is implanted in the substrate, the body diode, source and buried gate are implanted in a first (lower) epitaxial layer, and the top gate is implanted in a second (upper) epitaxial layer. Alignment marks on the first epitaxial layer are severely degraded during growth of the second epitaxial layer and, therefore, the alignment of the top gate to the buried gate is complex and inaccurate. This in turn limits the pitch scaling, i.e. size reduction of the device.

In addition, a significant pinch-off voltage variation occurs due to a thickness variation of the second epitaxial layer. A very complex process is needed to switch off a SiC JFET with a poorly controlled pinch-off voltage, and the use of such devices in parallel configuration (e.g. in a module application) is nearly impossible or at least quite complex.

Furthermore, a significant number of photolithography steps are needed to form the different implanted regions of a conventional SiC JFET with two epitaxial layers. Other conventional SiC JFETs are constructed from a single epitaxial layer grown on a semiconductor substrate, but do not include an integrated body diode. A body diode enables a JFET to conduct current in both directions. Body diodes are widely used as freewheeling diodes for inductive loads in configurations such as H-bridge or half bridge. SiC body diodes usually have high forward voltage drop, but can handle large currents and are sufficient in many applications, reducing part count and, thus, device cost and board space.

SUMMARY

According to an embodiment of a vertical JFET, the vertical JFET comprises a drain, a source, a gate, a drift region, and a body diode. The source, gate, drift region, and body diode are all disposed in the same compound semiconductor epitaxial layer. The drain is vertically spaced apart from the source and the gate by the drift region. The body diode is connected between the drain and the source. A corresponding method is also described for manufacturing such a vertical JFET.

According to an embodiment of a semiconductor device, the semiconductor device comprises an n-type substrate and a compound semiconductor epitaxial layer on the n-type substrate. The compound semiconductor epitaxial layer comprises a first n-type region on the n-type substrate and a second n-type region on the first n-type region. The second n-type region is more heavily doped than the first n-type region and has a recessed part and a non-recessed part. The compound semiconductor epitaxial layer also comprises a third n-type region on the non-recessed part of the second n-type region, the third n-type region being more heavily doped than the second n-type region. The compound semiconductor epitaxial layer further comprises a first p-type region extending through the third n-type region into the non-recessed part of the second n-type region, and a second p-type region in the recessed part of the second n-type region and laterally spaced apart from the first p-type region by part of the second n-type region.

According to an embodiment of a method of manufacturing a vertical JFET, the method comprises: forming a drain in a semiconductor substrate; forming a compound semiconductor epitaxial layer on the semiconductor substrate; and forming a source, a gate, a drift region, and a body diode all in the same compound semiconductor epitaxial layer. The drain is vertically spaced apart from the source and the gate by the drift region. The body diode is connected between the drain and the source.

Those skilled in the art will recognize additional features and advantages upon reading the following detailed description, and upon viewing the accompanying drawings.

BRIEF DESCRIPTION OF THE DRAWINGS

The components in the figures are not necessarily to scale, emphasis instead being placed upon illustrating the principles of the invention. Moreover, in the figures, like reference numerals designate corresponding parts. In the drawings.

DETAILED DESCRIPTION

According to the embodiments described next, a JFET semiconductor device is provided with the source, gate, drift region, and body diode all disposed in the same compound semiconductor epitaxial layer. With such a construction, the pinch-off voltage of the JFET is relatively independent of the epitaxial layer thickness. Also, fewer photolithography steps are employed to manufacture the JFET, and better pitch scaling (i.e. smaller device size) is provided due to alignment accuracy in the manufacturing process.

Figure 1:
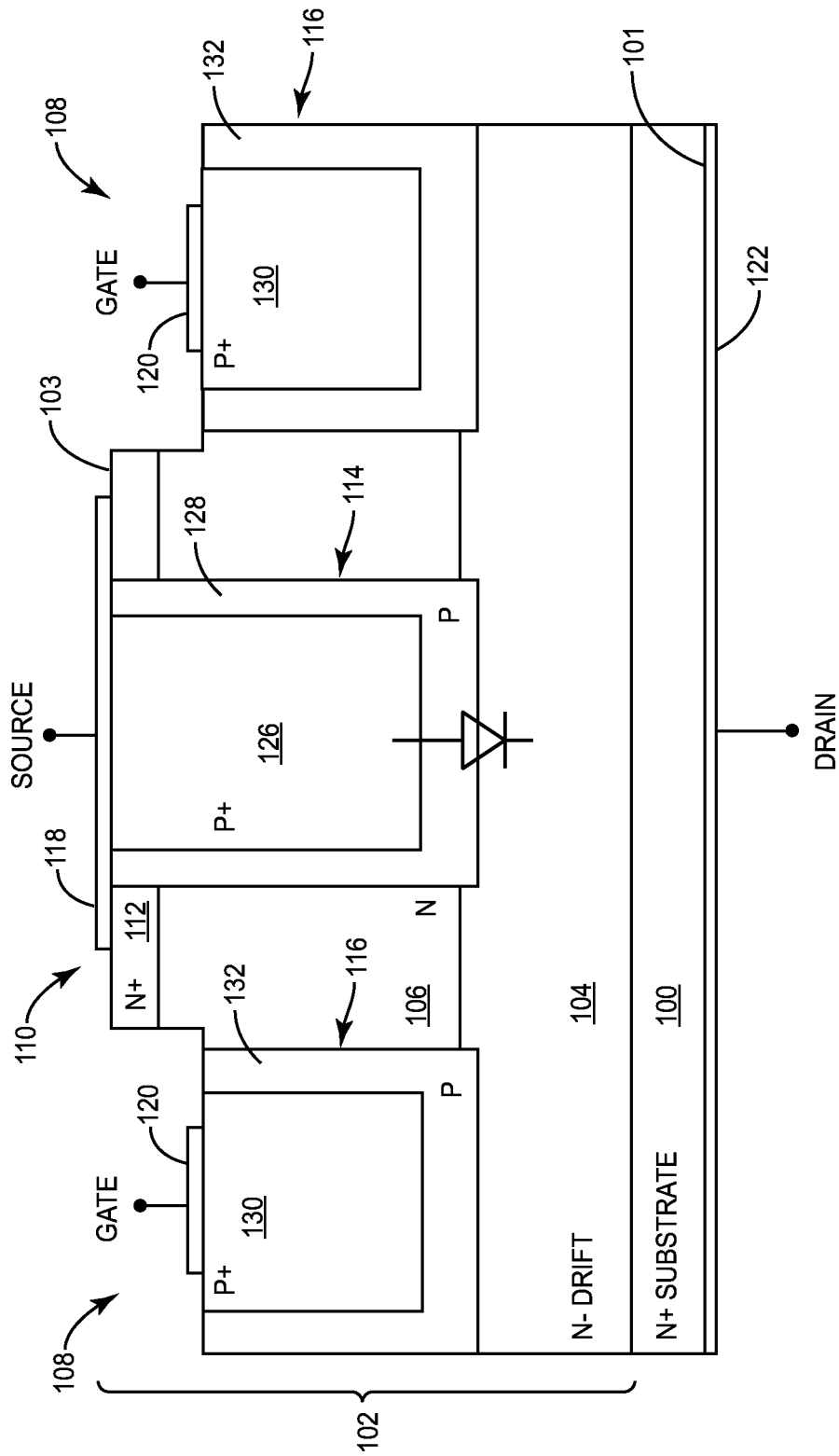
FIG. 1 illustrates a cross-sectional view of an embodiment of a vertical JFET having a source, gate, drift region, and body diode all disposed in the same compound semiconductor epitaxial layer.

FIG. 1 illustrates a partial cross-sectional view of a vertical JFET semiconductor device. According to this embodiment, the JFET device comprises an N+ semiconductor substrate 100 which forms the drain of the JFET device and a compound semiconductor epitaxial layer 102 on the substrate 100. In one embodiment, the epitaxial layer 102 comprises SiC. In another embodiment, the epitaxial layer 102 comprises GaN. Still other compound semiconductor materials may be used.

In each case, the compound semiconductor epitaxial layer 102 has an N− drift region 104 on the N+ substrate 100, and an N current spreading region 106 on the N− drift region 104. The notations 'N+', 'N' and 'N−' indicate the relative doping relationships between the substrate 100 and the drift and current spreading regions 104, 106 of the epitaxial layer 102. As such, the N current spreading region 106 is doped more heavily than the N− drift region 104, and the N+ substrate 100 is doped more heavily than the N current spreading region 104. Actual doping concentrations can vary widely depending on the compound semiconductor technology employed (e.g. SiC or GaN) and the voltage class of the JFET device. As such, specific doping concentrations are not identified herein. Those of ordinary skill in the art can readily identify specific doping concentrations of the different implanted regions of the device for a particular compound semiconductor technology and voltage class without undue experimentation. Therefore no further explanation is given in this regard.

The current spreading region 106 has a recessed part 108 and a non-recessed part 110. An N+ source region 112 of the JFET device is disposed on the non-recessed part 110 of the current spreading region 106, and is doped more heavily than the current spreading region 106.

A p-type region 114 extends through the N+ source region 112 into the non-recessed part 110 of the current spreading region 106. This p-type region 114 contacts the N+ source 112 and forms the anode of an integrated body diode. The portion of the N− drift region 104 adjacent the p-type anode 114 forms the cathode of the integrated body diode. The body diode is schematically illustrated in FIG. 1, and is connected between the N+ drain 100 and the N+ source 112. The body diode permits current to flow from the N+ source 112 to the N+ drain 100 when forward biased.

A second p-type region 116 is disposed in the recessed part 108 of the current spreading region 106. This p-type region 116 forms the gate of the JFET device. The gate 116 is vertically offset from the N+ source 112 because the gate 116 is formed in the recessed part 108 of the current spreading region 106. The p-type gate 116 is also laterally spaced apart from the p-type anode 114 of the body diode by part of the current spreading region 106. The portion of the current spreading region 106 adjacent the p-type gate 116 and between the N+ source 112 and the N− drift region 104 forms the vertical channel of the JFET device. The channel is controlled by the p-type gate 116, as is well known in the transistor arts. Therefore no further explanation is provided in this regard.

The source 112, gate 116, drift region 104, and body diode of the JFET device are all disposed in the same compound semiconductor epitaxial layer 102, according to the embodiment shown in FIG. 1. With such a construction, the pinch-off voltage of the JFET is relatively independent of the epitaxial layer thickness. Also, fewer photolithography steps are employed to manufacture the JFET, and better pitch scaling is provided due to alignment accuracy in the manufacturing process. An embodiment of the manufacturing process is described later herein with reference to FIGS. 3A through 3K.

The p-type anode 114 of the body diode and the N+ source 112 both terminate at the same side 103 of the compound semiconductor epitaxial layer 102 facing away from the N+ drain 100. According to this embodiment, the JFET device has a planar body contact configuration. Particularly, a metallization 118 is deposited on the side 103 of the compound semiconductor epitaxial layer 102 facing away from the N+ drain 100 over the non-recessed part 110 of the current spreading region 106. This metallization 118 forms the source contact. Another metallization 120 is deposited on the same side 103 of the epitaxial layer 102 over the recessed part 108 of the current spreading region 106. This metallization 120 forms the gate contact. A third metallization 122 is deposited on the backside 101 of the substrate 100 to form the drain contact. The source metallization 118 contacts both the source 112 and the p-type anode 114 of the body diode in a planar manner, according to the embodiment shown in FIG. 1.

Figure 2:
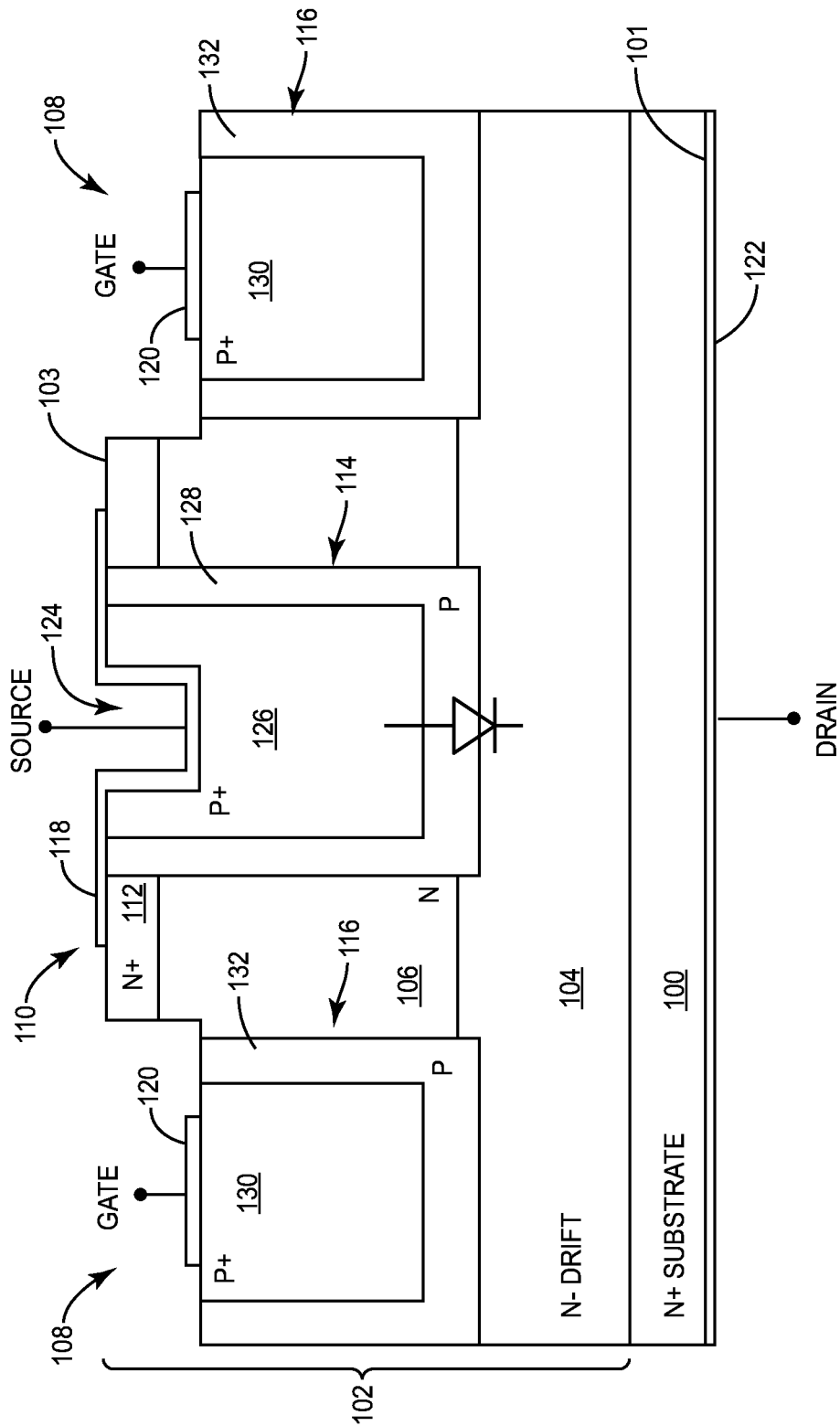
FIG. 2 illustrates a cross-sectional view of another embodiment of a vertical JFET having a source, gate, drift region, and body diode all disposed in the same compound semiconductor epitaxial layer.

FIG. 2 illustrates a partial cross-sectional view of a vertical JFET semiconductor device which is similar to the JFET device shown in FIG. 1, however, the JFET device has a trenched or recessed body contact configuration instead of a planar body contact configuration. According to this embodiment, the p-type anode 114 of the body diode has a recess 124 at the side 103 of the compound semiconductor epitaxial layer 102 facing away from the drain 100. The source metallization 118 contacts the anode 114 at this side 103 of the epitaxial layer 102 and in the recess 124. The recess 124 in the body diode can be lined with the source metallization 118, as shown in FIG. 2, or can be completely filled. In either case, the contact resistance to the body diode is reduced with such a recessed configuration because the surface area of the contact is increased.

In the embodiments shown in FIGS. 1 and 2, the p-type anode region 114 of the body diode can have an inner more heavily doped (P+) region 126 surrounded by an outer less heavily doped (P) region 128. The source 112 is spaced apart from the inner, more heavily doped region 126 of the body diode by the outer, less heavily doped region 128. Similarly, the gate 116 can have an inner, more heavily doped (P+) region 130 surrounded by an outer, less heavily doped (P) region 132. The outer, less heavily doped regions 128, 132 of the diode p-type anode 114 and gate 116 yield less leaky pn junctions with the surrounding compound semiconductor material of the opposite conductivity.

The embodiments shown in FIGS. 1 and 2 are described above in the context of an n-channel JFET, i.e. the gate 116 is p-doped, and the source 112 and drain 100 are n-doped. However, one of ordinary skill in the art readily understands that these doping types can be reversed to form a p-channel JFET, i.e. the gate 116 can be n-doped, and the source 112 and drain 100 p-doped. No further explanation is given in this regard.

Figure 3A:
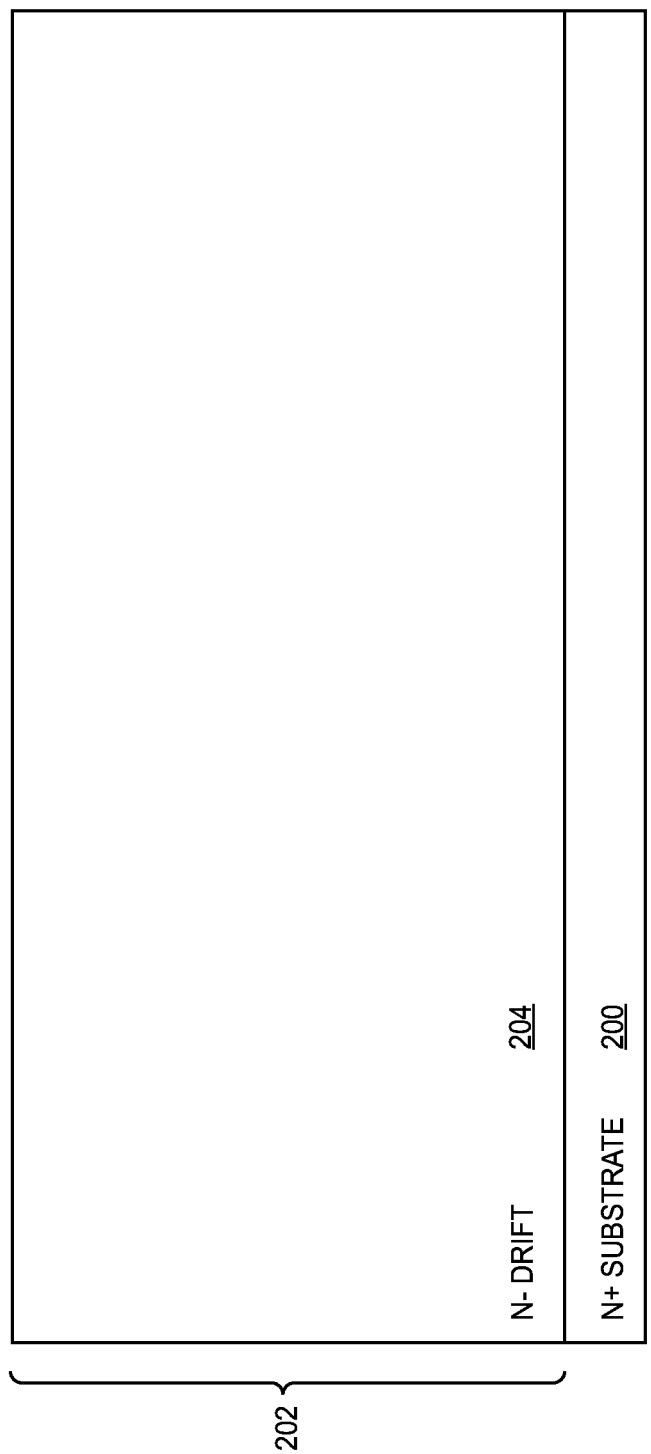
FIGS. 3A through 3K illustrate respective cross-sectional views of the vertical JFET of FIG. 2 at different stages of a manufacturing process according to an embodiment.

FIGS. 3A though 3K illustrate partial cross-sectional views of a JFET semiconductor device having a source, gate, drift region, and body diode, all disposed in the same compound semiconductor epitaxial layer during stages of an embodiment of a manufacturing method. The manufacturing method is described in the context of an n-channel JFET, i.e. the gate is p-doped and the source and drain are n-doped, but the doping types can be reversed to form a p-channel device instead. Various conventional processes well known to those skilled in the art, such as material deposition and removal, dopant implantation, annealing, etc., can be employed to form various parts of the JFET device. No further explanation is provided with regard to such processes.

FIG. 3A shows an N+ doped substrate 200 after an N− doped compound semiconductor material 202 is epitaxially grown on the substrate 200. The part of the compound semiconductor material 202 that remains doped N− during the subsequent processing forms the drift region 204 of the device. In one embodiment, the epitaxial layer 202 comprises SiC and the n-type dopants are nitrogen dopants.

Figure 3B:
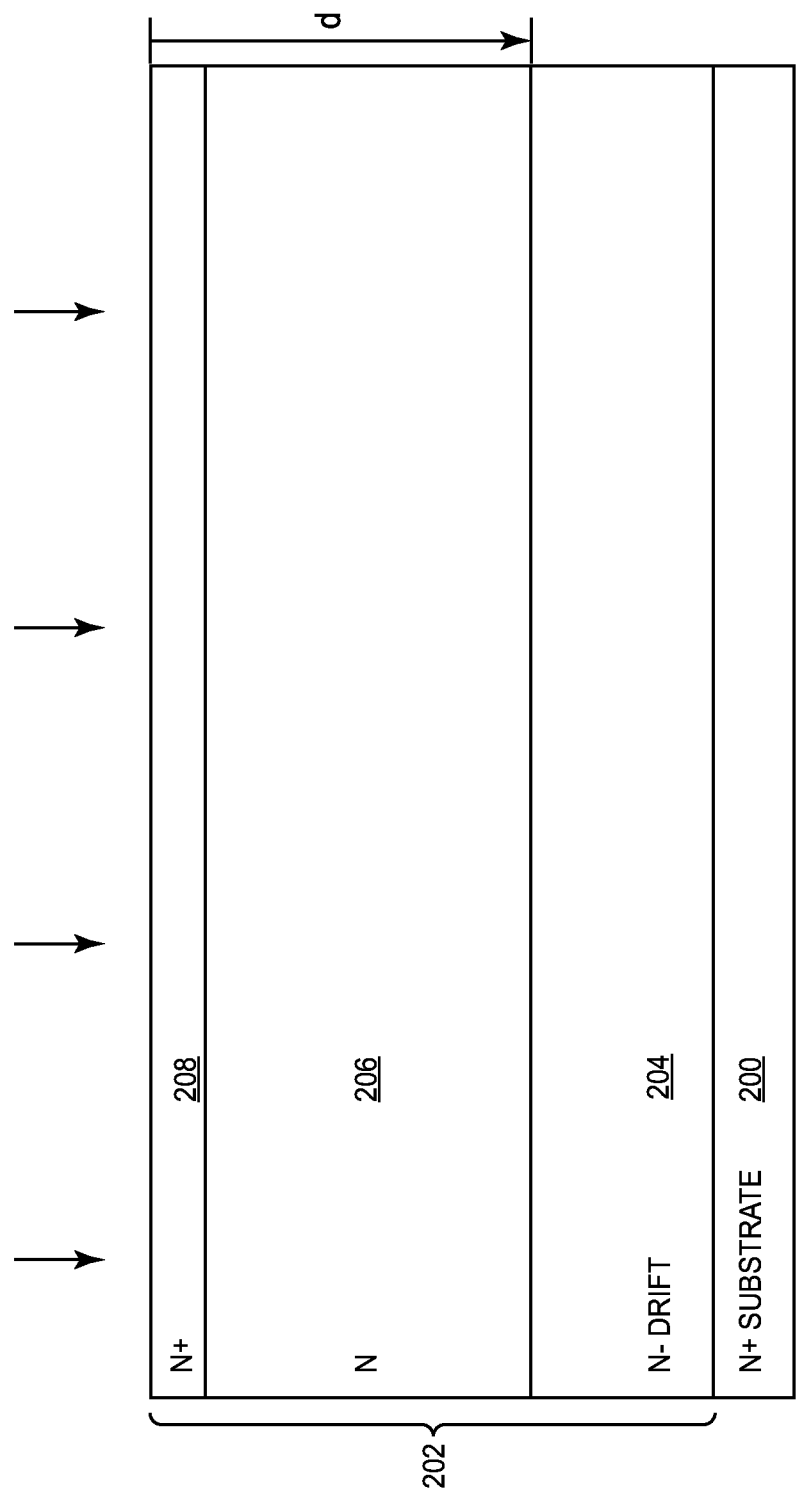

FIG. 3B shows the device structure during implantation of current spreading and source regions 206, 208 in the compound semiconductor epitaxial layer 202. According to an embodiment of a SiC epitaxial layer 202, the current spreading region 206 can be formed by implanting nitrogen atoms or other n-type dopants into the epitaxial layer 202 at a relatively high energy. The dopant implantation process is indicated by downward facing arrows in FIG. 3B. For a SiC system and nitrogen dopants, a double-charge implantation process can be used with an energy of at least 1700 keV so that the current spreading region 206 extends to a depth (d) of at least 1 μm in the epitaxially grown compound semiconductor material 202. In one embodiment, the energy of the double-charge implantation process is about 2.1 MeV, and the current spreading region 206 extends to a depth (d) of about 1.5 μm in the epitaxially grown compound semiconductor material 202. Still other implantation energies are possible. In each case, the current spreading region 206 is formed deep enough in the epitaxial layer 202 to ensure proper device operation for a particular voltage class. The N+ source layer 208 is formed by implanting n-type dopants at a higher dose and lower energy than used to form the current spreading region 206.

Figure 3C:
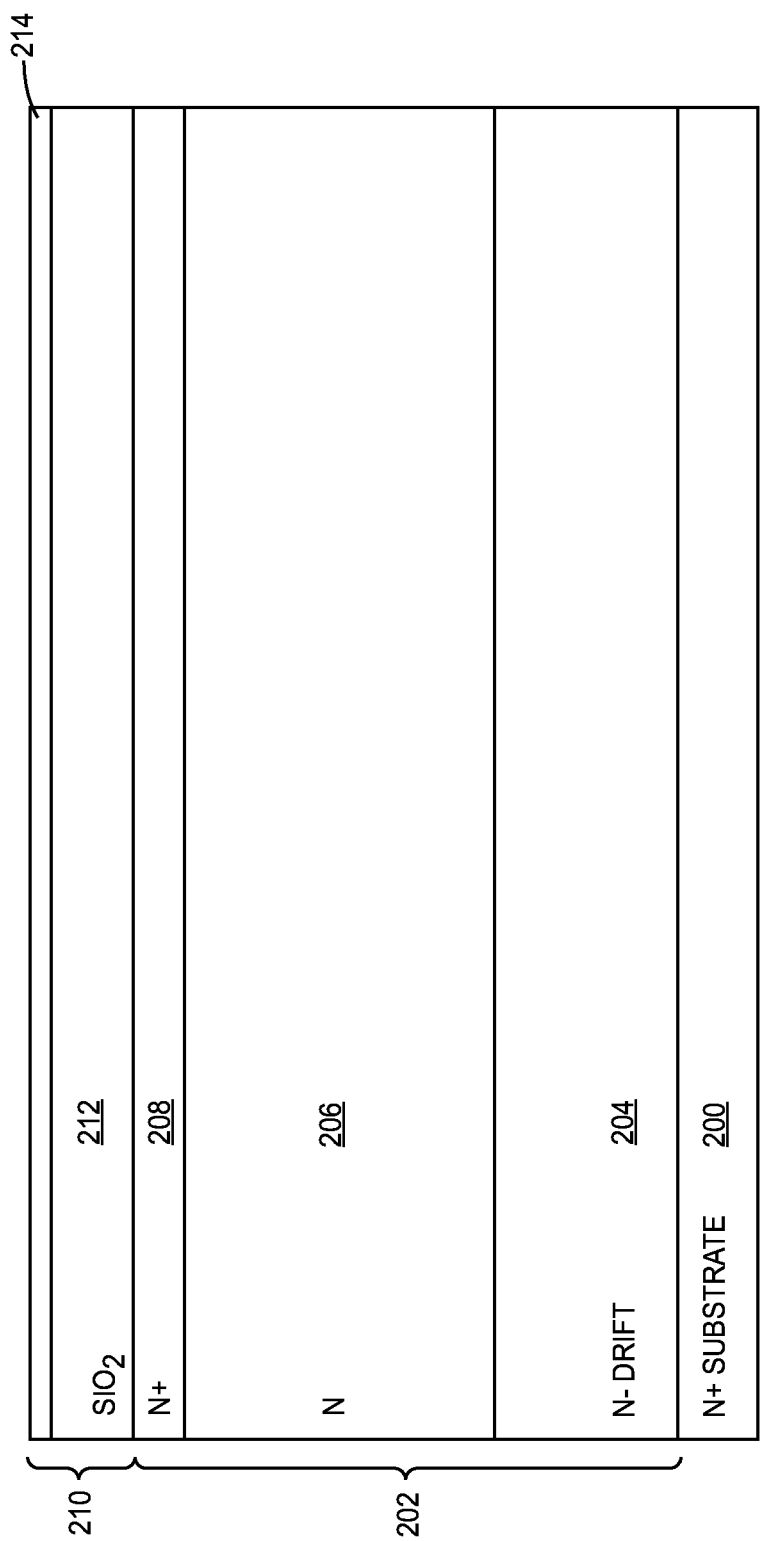

FIG. 3C shows the device structure after a mask 210 is formed on the N+ source layer 208. In one embodiment, the mask 210 comprises an oxide layer 212, such as $SiO_2$, on the N+ source layer 208 and a polysilicon layer 214 on the oxide layer 212. Other mask materials can be used.

Figure 3D:
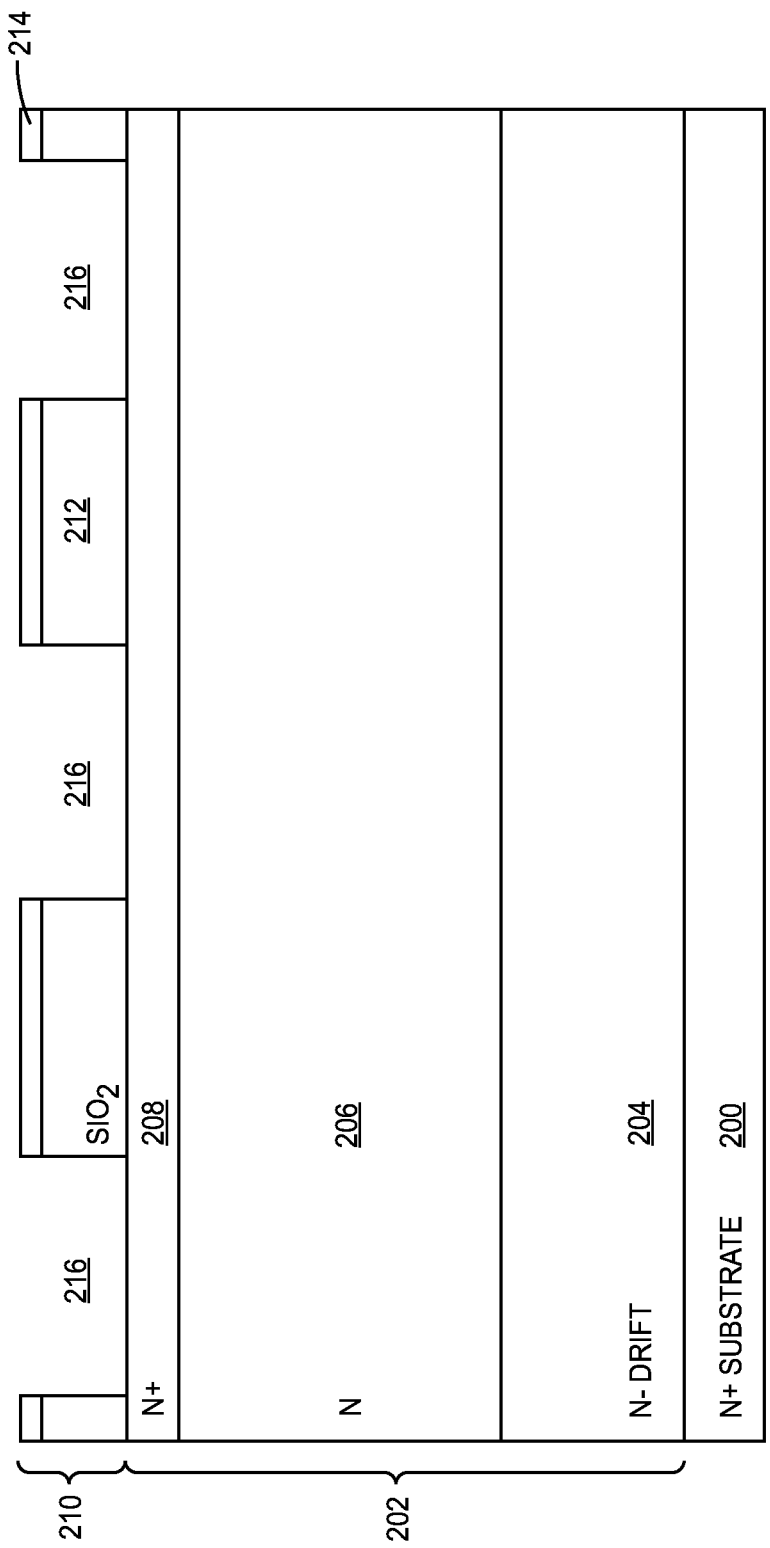

FIG. 3D shows the device structure after openings 216 are formed in the mask 210. The openings 216 expose part of the N+ source layer 208.

Figure 3E:
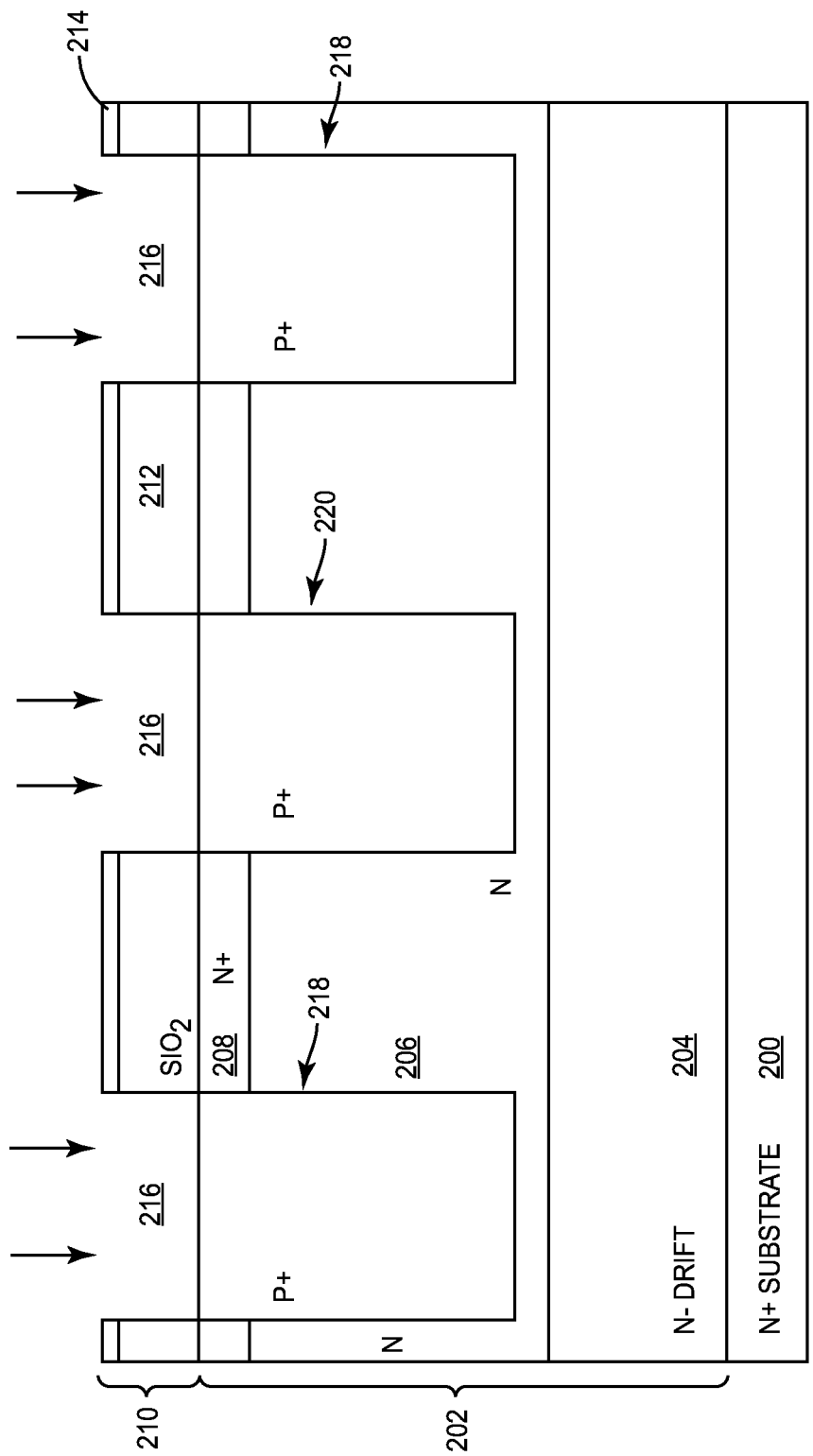

FIG. 3E shows the device structure during implantation of the gate 218 and anode region 220 of the body diode. P-type dopants, such as aluminum for a SiC system, are implanted into the exposed parts of the compound semiconductor epitaxial layer 202 through the openings 216 in the mask 210. The dopant implantation process is indicated by downward facing arrows in FIG. 3E. A high energy, high dose implant is performed so that the gate 218 and anode 220 of the body diode extend deep enough into the epitaxial layer 202 to ensure proper device operation for a particular voltage class. For example, the p-type dopants can be implanted with an energy of at least 1700 keV. In one embodiment, the implantation energy is about 2.1 MeV. Still other implantation energies are possible. In each case, the gate 118 and diode anode 120 do not extend as deep in the epitaxial layer 202 as the current spreading region 206. By implanting the gate 218 and diode anode 220 with a high dose (P+), good pinch-off and contact resistance are realized.

However, such highly-doped P+ regions 218, 220 result in leaky junctions. A higher quality pn junction can be realized by making the outer part of the gate 218 and body diode anode 220 more lightly doped than the inner part, as described next with reference to FIGS. 3F and 3G.

Figure 3F:
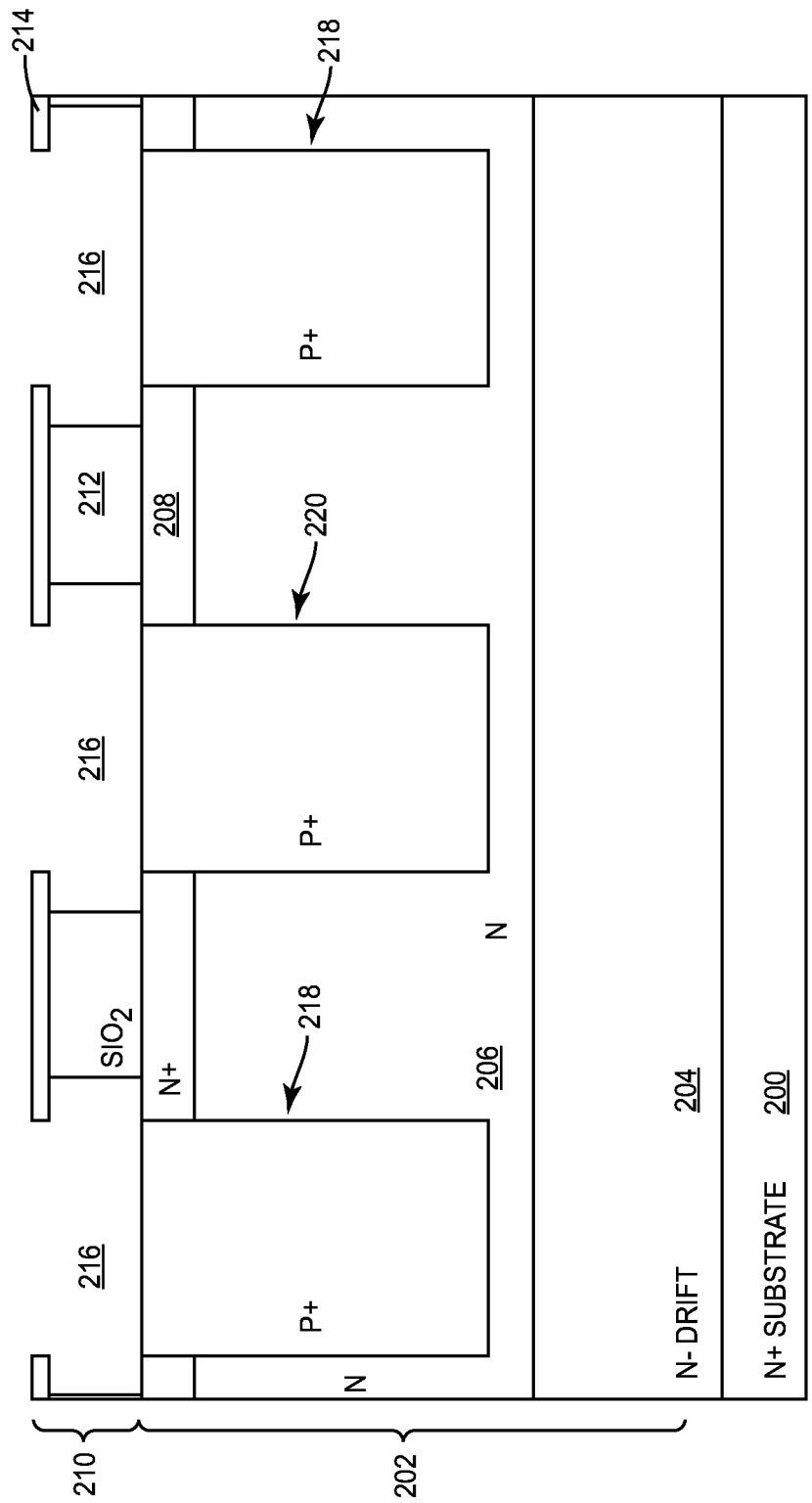

FIG. 3F shows the device structure after the openings 216 in the mask 210 are widened laterally by back etching part of the oxide layer 212 under the polysilicon layer 214. The wider mask openings 216 allow for a second p-type dopant implantation at a lower dose, in order to form more lightly doped outer regions of the gate 218 and body diode anode 220.

Figure 3G:
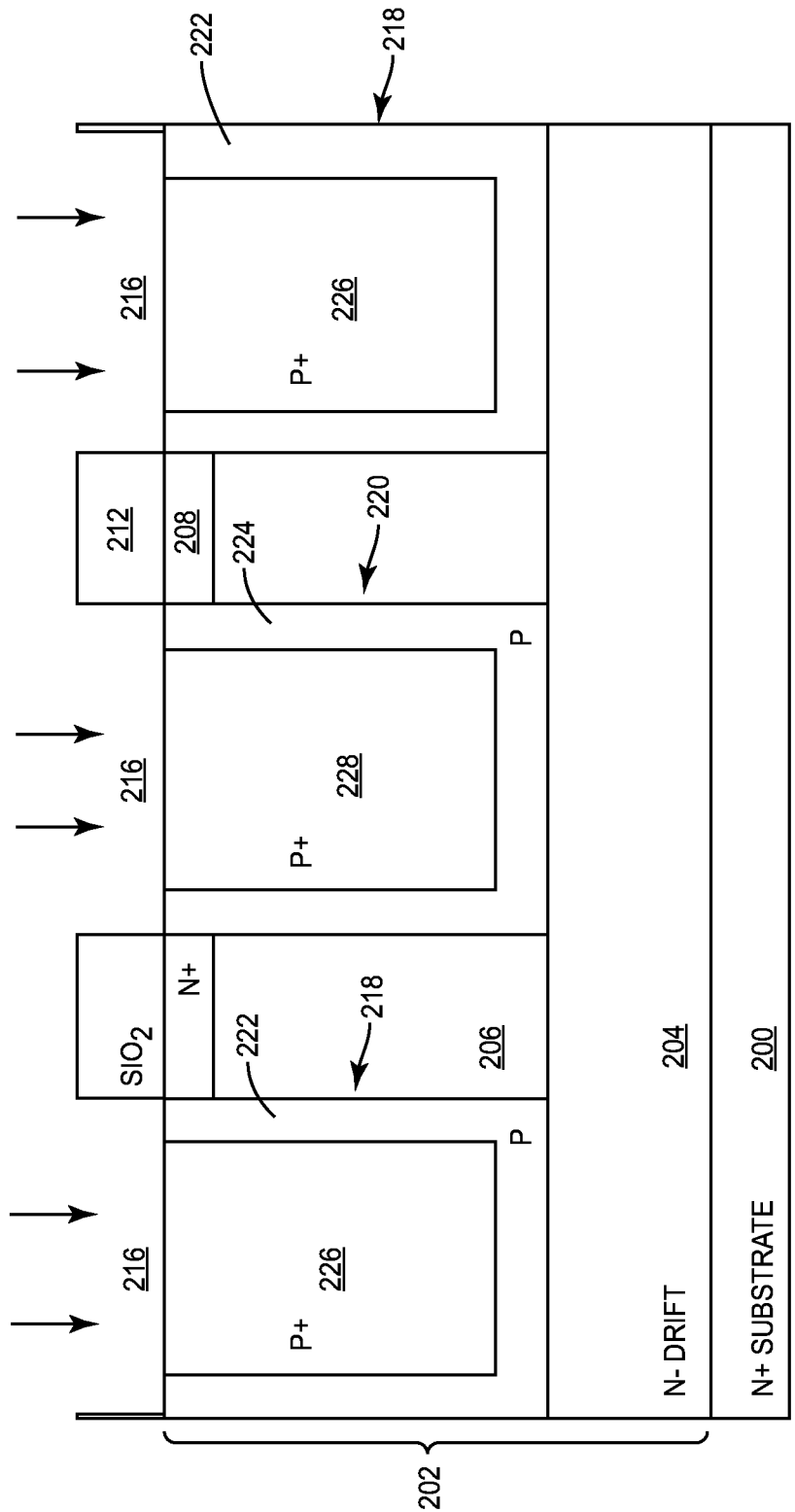

FIG. 3G shows the device structure after the polysilicon layer 214 of the mask 210 is removed from the oxide layer 212, and during implantation of more lightly doped outer regions 222, 224 of the gate 218 and body diode anode 220, respectively. The second p-type implantation is performed at a higher energy than the first p-type implantation so that the more lightly p-doped outer regions 222, 224 of the gate 218 and body diode anode 220 extend along the sides and bottom of the more highly p-doped inner regions 226, 228 of the gate 218 and anode 220, respectively. In one embodiment, the implantation energy is high enough so that the more lightly p-doped outer regions 222, 224 extend into the underlying drift region 204 below the gate 218 and anode 220, respectively. The source layer 208 contacts the more lightly p-doped outer regions 222, 224 of the gate 218 and body diode 220 at this point in the process, and the portion of the current spreading region 206 adjacent the gate 218 and between the source 208 and the drift region 204 forms the vertical n-channel of the JFET device.

Figure 3H:
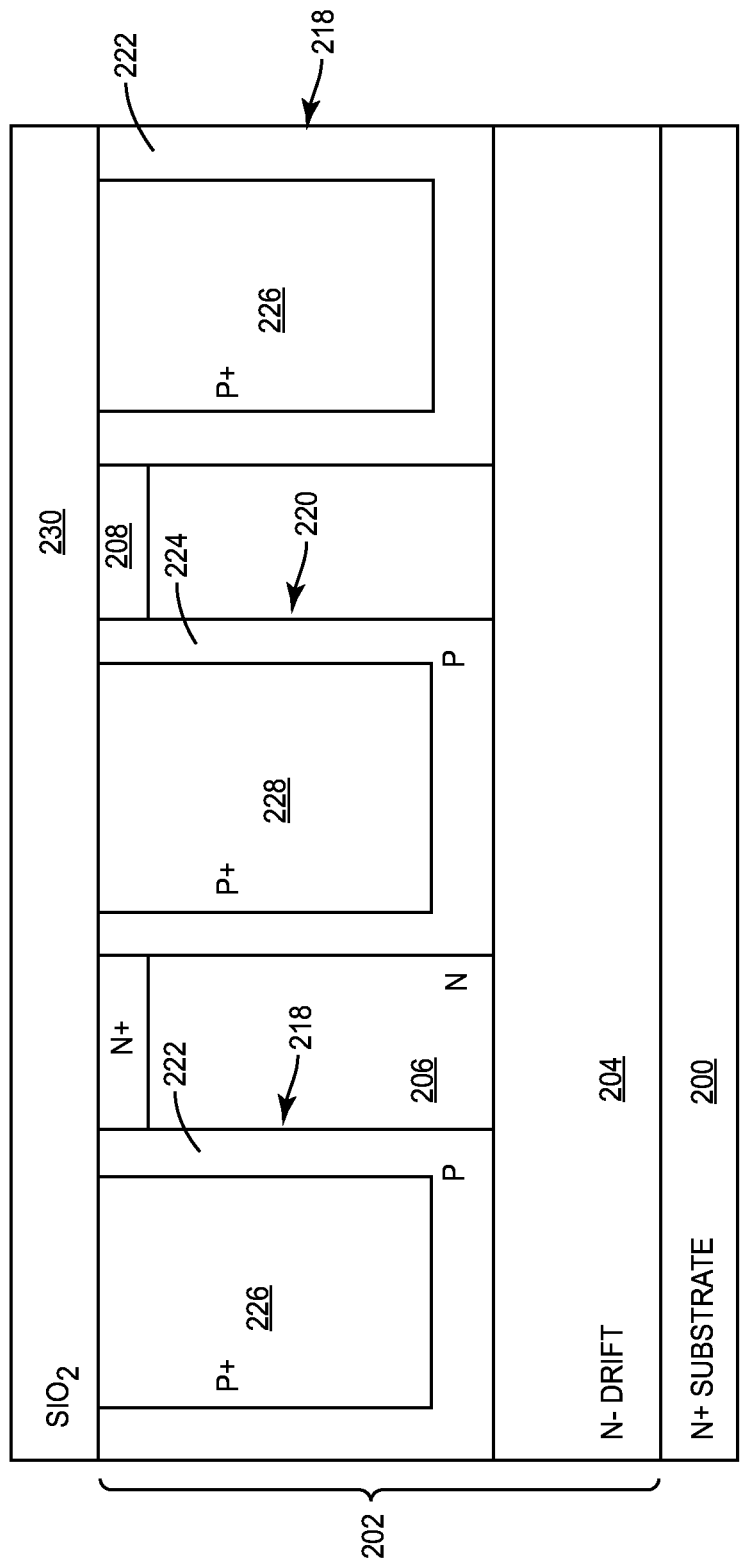

FIG. 3H shows the device structure after a second mask 230 is formed on the compound semiconductor epitaxial layer 202. In one embodiment, the second mask 230 comprises an oxide layer such as $SiO_2$ on the epitaxial layer 202. Other mask materials can be used.

Figure 3I:
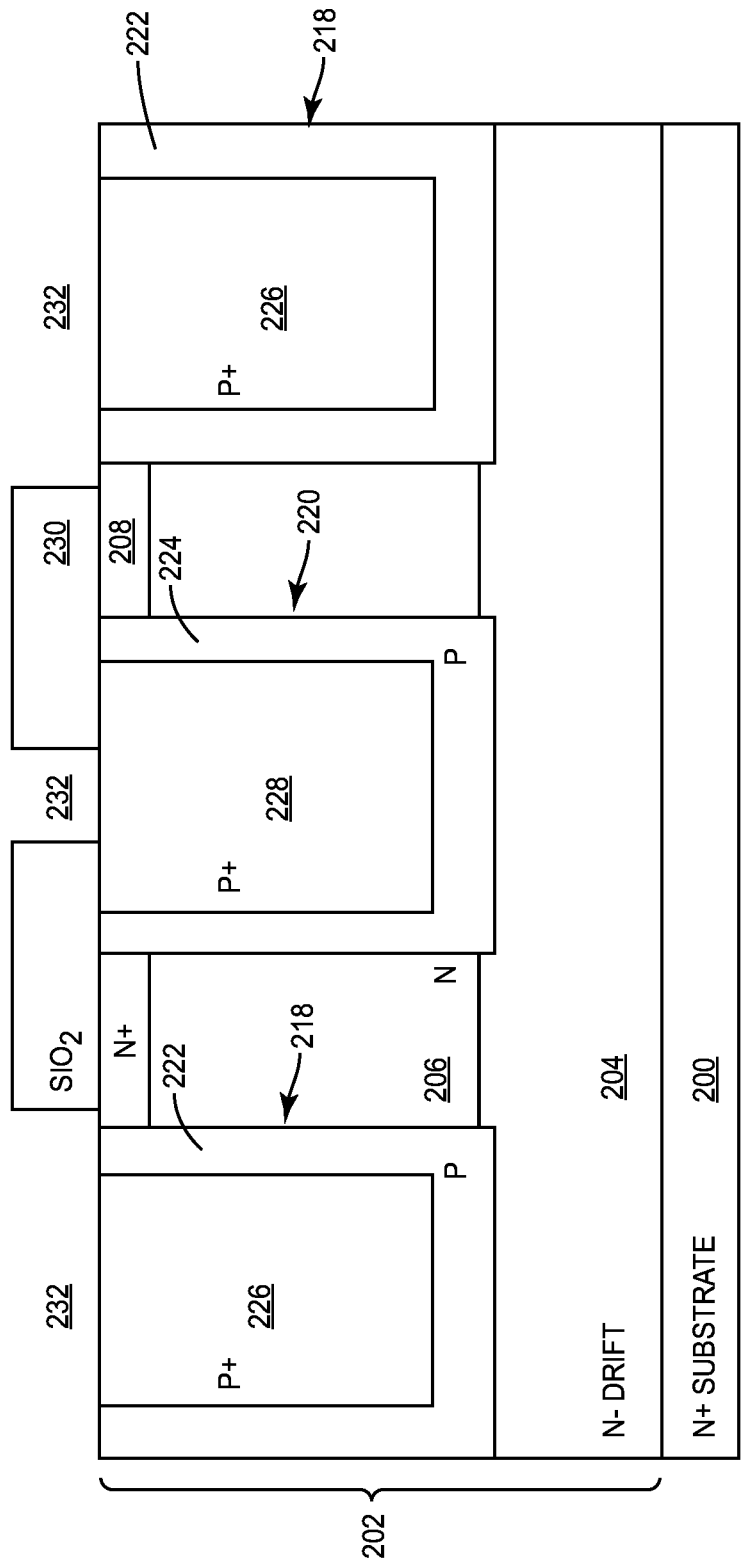

FIG. 3I shows the device structure after openings 232 are formed in the second mask 230. The openings 232 in the second mask 230 expose the gate 218 and the center of the body diode anode 220. The remainder of the anode 220 is covered by the second mask 230, as is most of the source layer 208.

Figure 3J:
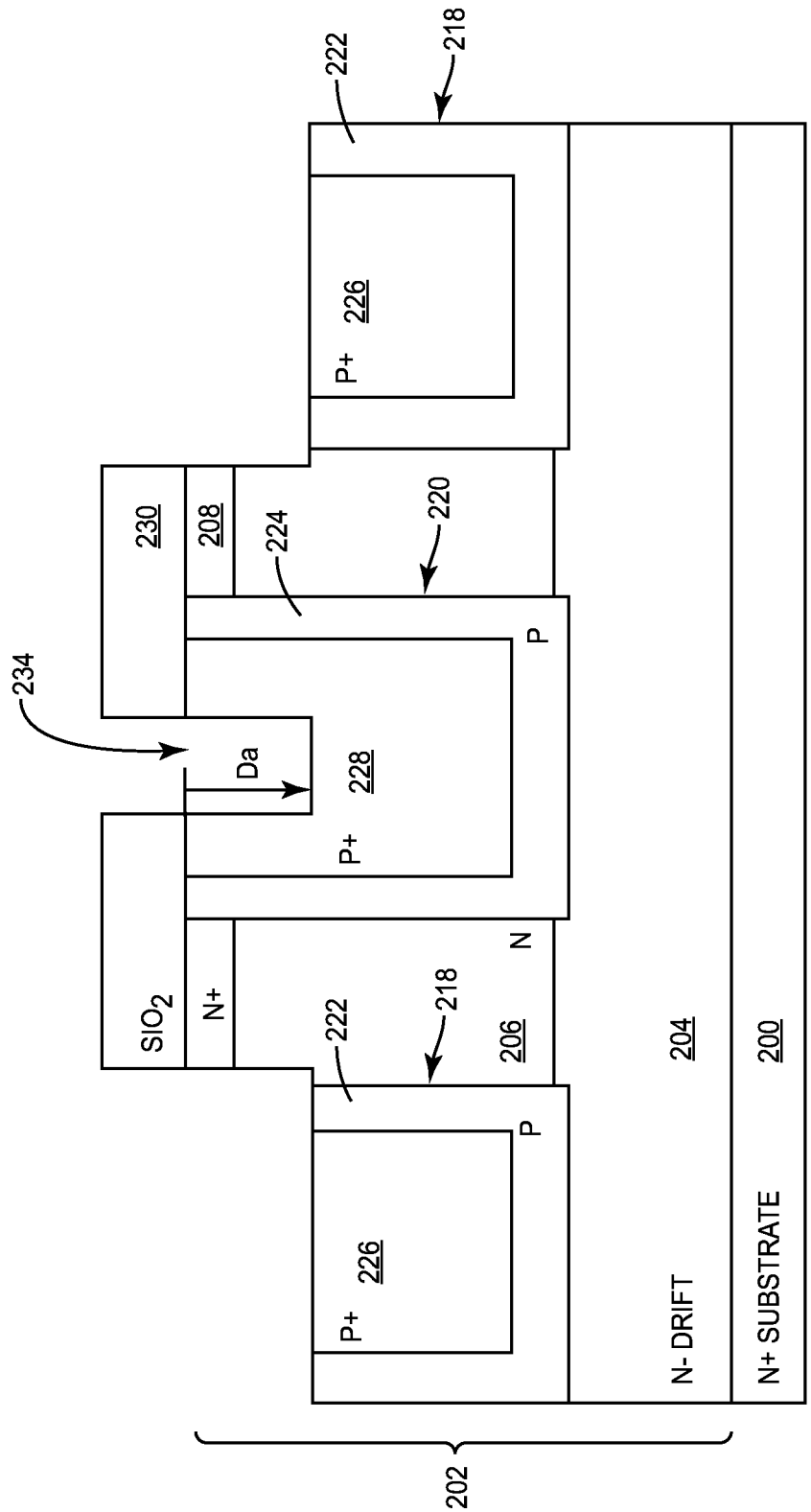

FIG. 3J shows the device structure after the part of the compound semiconductor epitaxial layer 202 unprotected by the second mask 230 is etched so that the source 208 is vertically offset from the gate 218. The etching process recesses the unprotected part of the epitaxial layer 202 below the source 208, ensuring the source 208 and gate 218 are sufficiently spaced apart from one another. A recess 234 is also formed in the center part of the body diode anode 220 to a particular depth (Da) in the epitaxial layer 202 during the gate etching process, as this part of the anode 220 is also unprotected by the second mask 230.

Figure 3K:
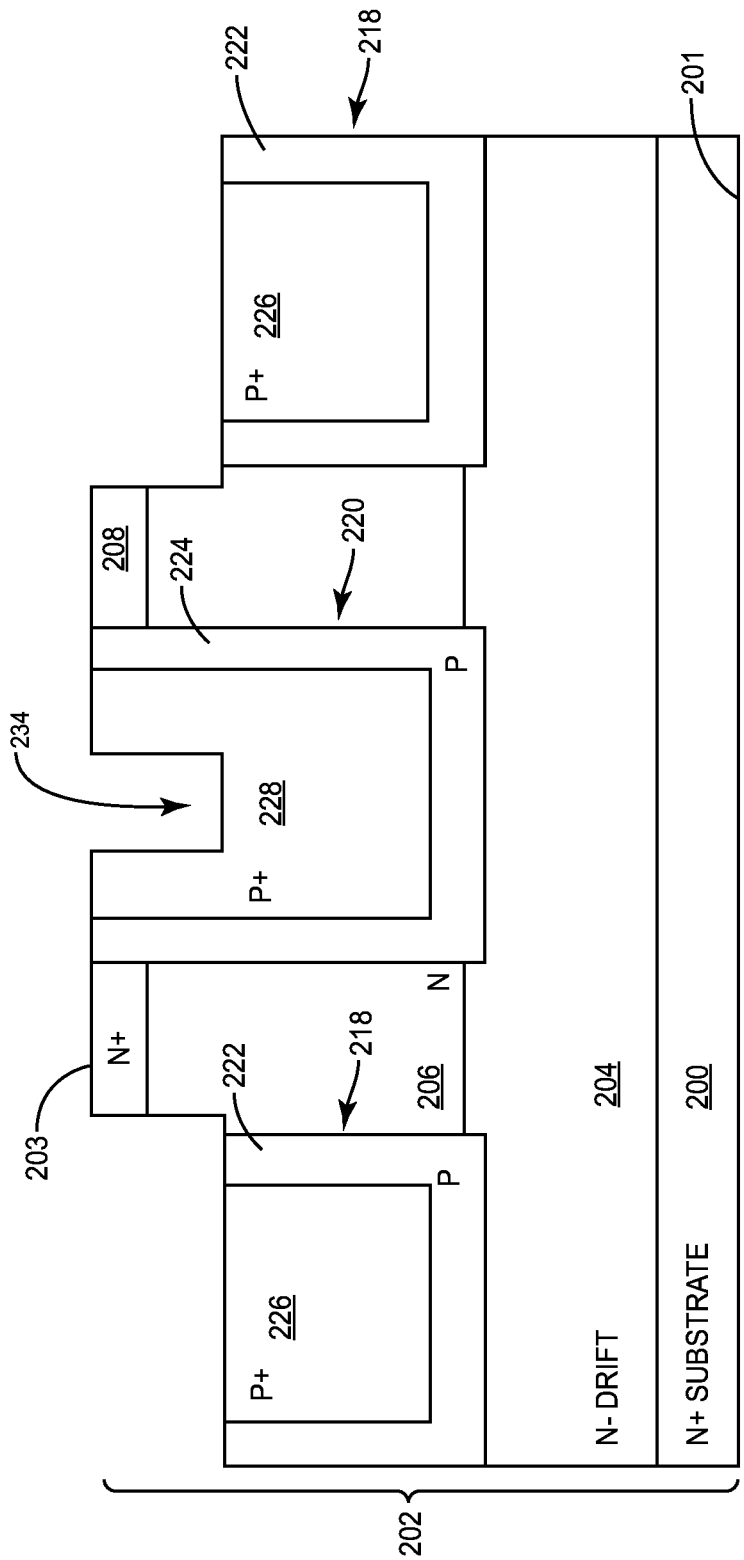

FIG. 3K shows the device structure after removal of the second mask 230. A metallization is then deposited on the backside 201 of the substrate 200 to form a drain contact. Additional metallizations are deposited on the side 203 of the epitaxial layer 202 facing away from the substrate 200. One of these metallizations contacts the gate 218, e.g. as shown in FIGS. 1 and 2. The other metallization contacts the anode 220 of the body diode at the side 203 of the epitaxial layer 202 facing away from the substrate 200 and in the recess 234 formed in the diode anode 220, and contacts the source 208 at the same side 203 of the compound semiconductor epitaxial layer 202, e.g. as shown in FIG. 2. In another embodiment, the second mask 230 remains intact over the anode 220 of the body diode during recessing (etching) of the gate 218. According to this embodiment, the source metallization contacts the source 208 and anode 220 of the body diode in a planar configuration, e.g. as shown in FIG. 1. In each case, the resulting JFET semiconductor device has a source 208, gate 218, drift region 204, and body diode all disposed in the same compound semiconductor epitaxial layer 202.

Figure 4:
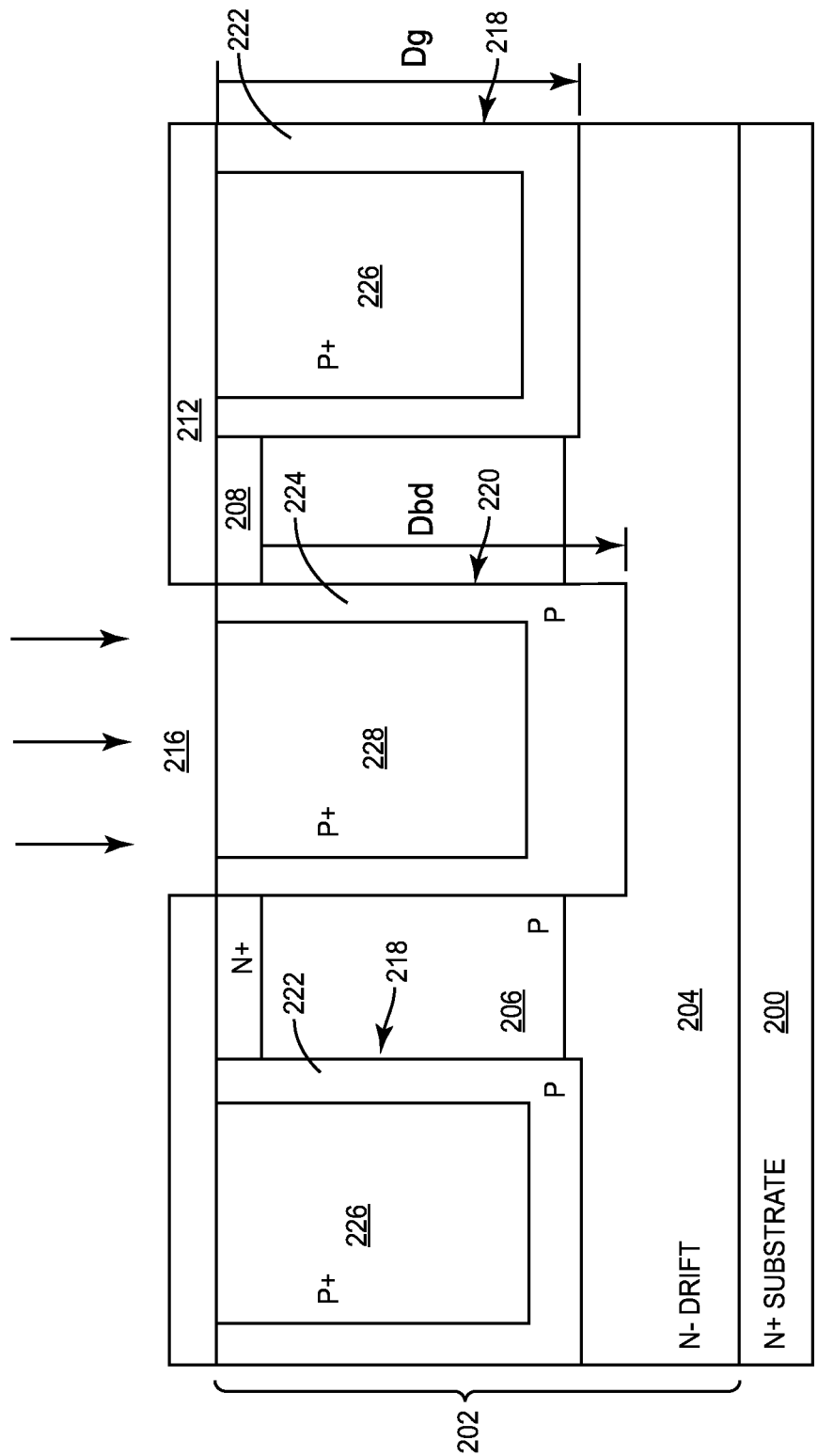
FIG. 4 illustrates a cross-sectional view of the vertical JFET at an additional stage of the manufacturing process according to another embodiment.

FIG. 4 illustrates a partial cross-sectional view of the JFET semiconductor device during an additional stage of the manufacturing process according to another embodiment. This stage can occur between the stages represented by FIGS. 3G and 3H, and involves an additional implant (e.g. p-type in the present example) in the body diode region but not in the gate region in order for the avalanche to occur under the source 208. To this end, the existing mask 212 is used to implant a low dose of p-dopants into the unmasked body diode anode 220 at a high energy level while the gate 218 is covered by the mask 212. The mask 212 can be regrown over the gate 218 to ensure only the body diode region is implanted with this high-energy, low-dose implant. The energy level of the optional implant is high enough so that the body diode anode 220 extends to a depth (Dbd) in the compound semiconductor epitaxial layer 202 further than a depth (Dg) of the gate 218.

The same or similar processing as discussed with regard to the embodiment of FIG. 3 can then be performed to complete the JFET device.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of manufacturing a vertical junction field effect transistor (JFET), the method comprising:
   forming a drain in a semiconductor substrate;
   forming a compound semiconductor epitaxial layer on the semiconductor substrate; and
   forming a source, a gate, a drift region, and a body diode, the body diode being laterally spaced apart from the gate, all in the same compound semiconductor epitaxial layer, the drain being vertically spaced apart from the source and the gate by the drift region, the body diode being connected between the drain and the source.

2. The method of claim 1, wherein forming the source, gate, drift region, and body diode all in the same compound semiconductor epitaxial layer comprises:
   epitaxially growing a doped compound semiconductor material on the semiconductor substrate;
   implanting dopants of a first conductivity type in the epitaxially grown compound semiconductor material to form the source and a current spreading region;
   forming a first mask on the epitaxially grown compound semiconductor material;
   implanting dopants of a second conductivity type opposite the first conductivity type in the epitaxially grown compound semiconductor material through openings in the first mask to form the gate and a first region of the body diode, the body diode having a second region formed by part of the drift region;
   forming a second mask on the epitaxially grown compound semiconductor material, the second mask exposing part of the epitaxially grown compound semiconductor material in a region of the gate; and
   recessing the part of the epitaxially grown compound semiconductor material exposed by the second mask so that the source is vertically offset from the gate.

3. The method of claim 2, further comptising forming a metallization on a side of the compound semiconductor epitaxial layer facing away from the semiconductor substrate, the metallization contacting the source and the first region of the body diode at the side of the compound semiconductor epitaxial layer facing away from the semiconductor substrate.

4. The method of claim 2, wherein the second mask has an opening exposing part of the first region of the body diode, the method further comprising:
   recessing the part of the first region of the body diode exposed by the second mask; and
   forming a metallization that contacts the first region of the body diode at a side of the compound semiconductor epitaxial layer facing away from the semiconductor substrate and in the recess, and contacts the source at the same side of the compound semiconductor epitaxial layer.

5. The method of claim 2, wherein dopants of the first conductivity type are implanted in the epitaxially grown compound semiconductor material at an energy of at least 1700 keV so that the current spreading region extends to a depth of at least 1 µm in the epitaxially grown compound semiconductor material.

6. The method of claim 2, wherein dopants of the second conductivity type are implanted in the epitaxially grown compound semiconductor material at an energy of at least 1700 keV.

7. The method of claim 2, therein forming the firs n of the body diode comprises:
   implanting a higher dose of dopants of the second conductivity type in the epitaxi ally grown compound semiconductor material through the openings in the first mask;
   widening the openings in the first mask after the higher dose of dopants of the second conductivity type is implanted in the epitaxially grown compound semiconductor material; and
   implanting a lower dose of dopants of the second conductivity type in the epitaxially grown compound semiconductor material through the widened openings in the first mask.

8. The method of claim 7, wherein the first mask comprises an oxide layer on the epitaxially grown compound semiconductor material and a polysilicon layer on the oxide layer, and wherein the openings in the first mask are widened by back etching part of the oxide layer under the polysilicon layer.

9. The method of claim 7, further comprising:
   covering the openings in the first mask over the gate after implanting the lower dose of dopants of the second conductivity type in the epitaxially grown compound semiconductor material; and
   implanting another lower dose of dopaants of the second conductivity type deeper in the epitaxially grown compound semiconductor material through the uncovered openings in the first mask over the body diode so that the first region of the body diode extends deeper into the epitaxially grown compound semiconductor material than the gate.

10. The method of claim 1, wherein the epitaxially grown compound semiconductor material is SiC.

11. The method of claim 1, wherein forming the gate and the body diode comprises:
   simultaneously implanting the gate and an anode of the body diode with a p-type dopant.

12. The method of claim 1, wherein forming the body diode comprises:

implanting an anode of the body diode with a p-type dopant while the gate is covered by a mask.

* * * * *

UNITED STATES PATENT AND TRADEMARK OFFICE
CERTIFICATE OF CORRECTION

PATENT NO. : 9,666,696 B2
APPLICATION NO. : 14/935139
DATED : May 30, 2017
INVENTOR(S) : Esteve et al.

Page 1 of 1

It is certified that error appears in the above-identified patent and that said Letters Patent is hereby corrected as shown below:

In the Claims

At Column 7, Line 64 (Claim 3, Line 1), please change "comptising" to --comprising--.

At Column 8, Line 25 (Claim 7, Line 1), "therein forming the firs n" should be --therein forming the first--.

At Column 8, Line 28 (Claim 7, Line 4), "epitaxy ally" should be --epitaxially--.

Signed and Sealed this
Twenty-second Day of August, 2017

Joseph Matal
*Performing the Functions and Duties of the*
*Under Secretary of Commerce for Intellectual Property and*
*Director of the United States Patent and Trademark Office*